United States Patent [19]

Rosen et al.

[11] Patent Number: 4,899,204
[45] Date of Patent: Feb. 6, 1990

[54] HIGH VOLTAGE SWITCH STRUCTURE WITH LIGHT RESPONSIVE DIODE STACK

[75] Inventors: Har'el Rosen; Arye Rosen, both of Cherry Hill, N.J.

[73] Assignee: General Electric Company, Morrestown, N.J.

[21] Appl. No.: 128,116

[22] Filed: Dec. 1, 1987

[51] Int. Cl.$^4$ ............................................. H01L 27/14
[52] U.S. Cl. ......................................... 357/30; 357/32; 357/81; 357/17; 357/45; 357/82
[58] Field of Search ................. 357/17, 19, 32, 45, 357/81, 82, 30 G, 30 H, 30 L, 30 P, 30 D, 30 R, 30 J, 13

[56] References Cited

U.S. PATENT DOCUMENTS

| | | | |
|---|---|---|---|
| Re. 31,806 | 1/1985 | Scifres et al. | 372/50 |
| 3,374,404 | 3/1968 | Luecke | 317/234 |
| 3,745,429 | 7/1973 | Fujishiro | 357/19 X |
| 3,832,732 | 8/1974 | Roberts | 357/19 |
| 3,917,943 | 11/1975 | Auston | 250/211 J |
| 4,122,479 | 10/1978 | Sugawara | 357/19 |
| 4,127,784 | 11/1978 | Proud, Jr. et al. | 307/311 |
| 4,240,088 | 12/1980 | Myers | 357/19 |
| 4,281,253 | 7/1981 | Culver | 250/551 |
| 4,359,773 | 11/1982 | Swartz et al. | 372/26 |
| 4,368,481 | 1/1983 | Ohashi et al. | 357/30 |
| 4,376,285 | 3/1983 | Leonburger et al. | 357/17 |
| 4,388,633 | 6/1983 | Vasudev | 357/17 |
| 4,396,833 | 8/1983 | Pan | 250/211 J |
| 4,399,453 | 8/1983 | Berg | 357/81 |
| 4,491,977 | 1/1985 | Paul | 455/327 |
| 4,509,173 | 4/1985 | Umeda et al. | 372/50 |
| 4,536,607 | 8/1985 | Wiesmann | 357/30 J X |
| 4,547,396 | 10/1985 | Botez et al. | 427/87 |
| 4,547,956 | 10/1985 | Bouadma et al. | 29/569 L |
| 4,577,321 | 3/1986 | Carney et al. | 372/50 |
| 4,673,864 | 6/1987 | Dessens et al. | 323/221 |
| 4,675,624 | 6/1987 | Rosen et al. | 333/161 |
| 4,675,628 | 6/1987 | Rosen | 333/164 |
| 4,697,096 | 9/1987 | Conrad et al. | 307/246 |

OTHER PUBLICATIONS

Rosen et al., "High-Power, Low-Loss PIN Diodes for Phased-Array Radar," *RCA Review*, Mar. 1979, vol. 40, No. 1, pp. 22-58.

Herczfeld et al., "Optically Controlled Microwave Devices and Circuits," *RCA Review*, Dec. 1985, pp. 538-551.

Sze, *Physics of Semiconductor Devices*, 2nd Ed., John Wiley & Sons, 1981, pp. 39-41 & 749-760.

Fowler, "Cumulative Photovoltaic Power," IBM Technical Disclosure Bulletin, vol. 4, No. 10, Mar. 1962, p. 61.

Anacker, "Liquid Cooling of Intergrated Circuit Chips," *IBM Technical Disclosure Bulletin*, vol. 20, No. 9, Feb. 1978 pp. 3742-3743.

Robinson, "Taking the Guesswork Out of Semiconductor Heat Sink Selection," *Electronic Engineering*, Mar. 1971, vol. 43, No. 517, pp. 55-58.

"Two VVCs are Often Better Than One-If They're Back-to-Back", published at pp. 130, 131 of the May 10, 1969 issue of *Electronic Design*, Gile.

(List continued on next page.)

*Primary Examiner*—William Mintel
*Attorney, Agent, or Firm*—William H. Meise; Raymond E. Smiley

[57] ABSTRACT

A light-activated PIN diode switch arrangement is coupled to a source of direct voltage and to a load for control of the flow of load current. The PIN diode switch arrangement is connected so as to be electrically reverse-biased, so that no current flows therethrough. A source of light is coupled to the active portion of the PIN diode switch arrangement for rendering it conductive when flooded with light. High power and low inductance is provided by a configuration in which two PIN diode sets are physically and electrically connected together in a physical and electrical stack by a conductive heat sink. Laser diode arrays above and below the diodes of the stack selectively illuminate the intrinsic region of each diode bath through the adjacent doped region and also directly through the side of the diode.

12 Claims, 9 Drawing Sheets

OTHER PUBLICATIONS

"High-Power, Low-Loss PIN Diodes for Phased-Array Radar," by Rosen et al. published in RCA REVIEW, Mar. 1979, vol. 40, No. 1.

"Optical Control of Millimeter-Wave Propagation in Dielectric Waveguides" by Lee et al., Mar. 1980 edition of IEEE Journal of Quantum Electronics.

"Optoelectronically Pulsed Slot-Line Antennas", by Heidemann et al., published in Electronic Letters, 28 Apr. 1983, vol. 19, No. 9.

"Direct dc to rf Conversion by Picosecond Optoelectronic Switching", by Chang et al.

"Optically Controlled Microwave Diodes and Circuits", by Herczfeld et al., published in RCA Review, Dec. 1985.

"Physics of Semiconductor Devices", by S. M. Sze, second edition, published by John Wiley & Sons, 1981, pp. 39–41 and pp. 749–760.

HIGH VOLTAGE SWITCH STRUCTURE WITH LIGHT RESPONSIVE DIODE STACK

This invention relates to semiconductor electrical switches for the switching of high voltages, and more particularly to the use of series connections of PIN diodes in such switches.

There are many applications for high-voltage switches. One such application is the switching of energizing potential to a high power microwave tube for generating short pulses of microwave energy. In the past, mercury-wetted relays have been used for such switching, but they have a relatively limited maximum rate of operation or pulse recurrence frequency (PRF), and being mechanical devices, their life is also relatively limited. Under certain conditions, spark gaps, gas tubes and other arrangements can be used, but they have certain disadvantages. These disadvantages include requirements for trigger voltages of as high as 600 volts, voltage drops of more than several volts, jitter or uncertainty in the time of conduction relative to the time of triggering, and most notably an inability to be turned off by a simple trigger signal (which requires that they either be commutated for turn-off, or transmission-line techniques must be used to produce a pulse with a defined pulse width.) The desire to use solid-state devices for high speed switching has led to the use of optoelectronic switches using the bulk properties of semi-insulating substrates, as described in U.S. Pat. Nos. 3,917,943 issued Nov. 4, 1975 to Auston, 4,127,784 issued Nov. 28, 1978 to Proud, Jr. et al., and 4,376,285 issued Mar. 8, 1983 to Leonburger et al. The light pulse control of the conduction is relatively jitter-free, and provides substantial isolation between the control circuit and the high-voltage controlled circuit. In these optoelectronic switches, the bulk semiconductor material is normally essentially nonconductive, but becomes conductive by the application of light, the photons of which generate electron-hole pairs in the bulk semiconductor which render the material conductive. However, when such bulk semiconductor switches are used for the control of high voltages, they suffer from the disadvantage of thermal runaway in the OFF or nonconductive state. In thermal runaway, the high field strength within the semiconductor material causes sufficient current flow to produce heating of the bulk material, which in turn increases the number of charge carriers available and therefore increases the current. The increased current further increases the heating effect to produce more current. Such thermal runaway can result in failure of the switch.

U.S. Pat. No. 4,673,864 issued June 16, 1987 to Dessens et al describes optical control of series-connected avalanche semiconductor elements for use in switching high voltages. Avalanche devices such as those described are generally noisy due to the avalanche process, and may not be useful in many applications because the turn-on may generate AM and FM noise, and the turn-off may be delayed, depending upon the amount of avalanche multiplication. The photon absorption efficiency as a function of conductivity profile of highly doped layers is difficult to determine and varies markedly in dependence upon the wavelength, the semiconductor material, the temperature of the semiconductor material, and the type and amount of doping. Thus, the avalanche device performance is more difficult to predict by comparison with the performance of the PIN device. In addition, the avalanche device is more difficult to manufacture than a PIN device, and therefore more expensive. The expense of the Dessen et al switch is increased by the necessity for both series and shunt switch components, and by the need or a polyphase drive.

U.S. Pat. No. 4,240,088 issued Dec. 16, 1980 to Meyers describes a semiconductor high voltage switch in which optoelectronic control of a reverse-biased PIN diode is provided. The Meyers PIN diode arrangement is advantageous when compared with the bulk semiconductor switch, because the depletion region produced near the reverse-biased junction reduces the reverse saturation current in comparison with the leakage current of the bulk silicon device. As as a result, the PIN diode can be reverse-biased for long periods of time without thermal runaway. Also, good ohmic contact is possible with the heavily doped P+ and N+ regions of the PIN diode in comparison with the bulk device.

Compared with the Dessens et al arrangement, the Meyers PIN diode arrangement is advantageous because only a single element (i.e. a series element or a shunt element) is required and because polyphase control is not required. Also, the PIN diode has only three semiconductor layers, so is relatively easy to manufacture when compared with some avalanche devices. The intrinsic (I) layer of the PIN diode is the important photon-absorbing portion, so such characteristics as the absorption efficiency, and lifetime are readily established.

As mentioned by Meyer, in the absence of light incident on the intrinsic material of the PIN diode, the diode is capable of sustaining a reverse voltage of a magnitude proportional to the width of the intrinsic region. The physical reasons why this occurs are not completely clear. As described by Meyer, an intrinsic region of silicon $\frac{1}{4}$ mm long can withstand reverse voltages up to about 2000 volts with leakage currents the nanoampere (nA) region. Thus, if it were desired to switch a voltage of 8000 volts, the intrinsic region would have to be about 1 mm long. However, since the speed of response of a PIN diode is inversely proportional to the length of the intrinsic region, this would reduce the operating or switching speed by a factor of 4. If the assumption is made that the scatter-limited carrier velocity is about $10^7$ cm/sec. in the intrinsic silicon material, the $\frac{1}{4}$ mm device would have a response time of about 2.5 nanoseconds, whereas an 8000 volt, 1 mm device would have a response time of about 10 nanoseconds. Thus, the high voltage and high speed requirements conflict. It would be desirable to have a PIN diode switch adapted for high power operation in which high speed and high voltage switching could be obtained simultaneously, and with a low on resistance.

SUMMARY OF THE INVENTION

An electrical switch arrangement includes a first PIN diode including mutually opposed first and second flat surfaces, the first surface being one of a P and N electrode, and the second surface being an electrode of the other one of P and N. A second PIN diode has corresponding mutually opposed surfaces. The first surface of the second PIN diode is at least in electrical contact with the second surface of the first PIN diode for generating a series combination. A coupling arrangement is coupled to the first surface of the first PIN diode and to the second surface of the second PIN diode and is adapted for coupling to a source of electrical potential associated with a load to be switched, in such a manner that the first and second PIN diode are reverse-biased, thereby preventing significant current flow. A switching control arrangement is coupled to the first and second PIN diodes for selectively illuminating at least an interior portion of the first and second PIN diodes for easing the diodes to conduct in the presence of light and for allowing the PIN diodes, in the absence of light, to revert to a non-conducting state. In a particular embodiment, the first and second PIN diodes are arranged in a physical stack, and the switching control arrangement causes light to enter the first PIN diode by its first surface and the second PIN diode by its second surface.

DESCRIPTION OF THE DRAWING

FIG. 3b is a corresponding cross-section of an end element of the arrangement of FIG. 3a;

FIGS. 4a–4i, referred to jointly as FIG. 4, illustrate steps in the formation of a lateral PIN diode structure such as that illustrated in FIG. 3a;

DESCRIPTION OF THE INVENTION

Figure 1A:
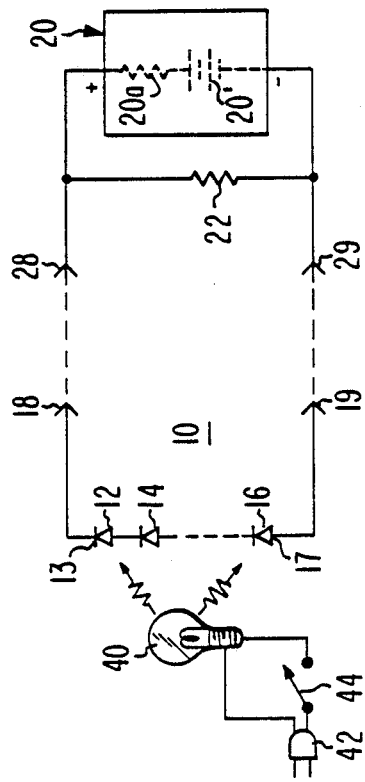
FIGS. 1a and 1b, referred to jointly as FIG. 1, illustrate in simplified schematic form a series combination of discrete PIN diodes connected to various combinations of direct voltage sources and loads.

FIG. 1a illustrates a series switching arrangement 10 in accordance with the invention, which includes a plurality of PIN diodes 12, 14 . . . 16 connected in series, with the anode electrode of one diode connected to the cathode electrode of the next adjacent electrode. As illustrated, end diode 12 has a cathode electrode 13 which is not connected to another PIN diode, and which is therefore available as an external electrode for coupling by way of a terminal 28 to a circuit external to switching circuit 10. Similarly, end diode 16 has an anode electrode 17 which is not coupled to another PIN diode, and which is therefore available for connection by a terminal 29 to a circuit external to switching arrangement 10.

Switching arrangement 10 is adapted to be connected to a source of direct current and to a load, which in FIG. 1a are represented by a source 20 and a resistor 22, respectively. Before switching arrangement 10 is connected to the combination of source 20 and resistor 22, the source voltage will appear across terminals 28 and 29, with terminal 28 poled positively relative to terminal 29. If the PIN diodes of switching circuit 10 are then connected to source 20 and resistor 22 by connecting terminal 18 to terminal 28 and terminal 19 to terminal 29, the polarity of the source is such as to reverse-bias PIN diodes 14–16. When the PIN diodes are reverse-biased, negligible current flows therethrough, and current will flow from source 20 through resistor 22 for energization of the load which the resistor represents.

An optoelectronic control system is coupled to PIN diodes 12, 14 . . . 16 of switching arrangement 10 for control of the conductive state thereof. As illustrated in FIG. 1a, the light control circuit includes a source of light illustrated as a light bulb 40 adapted to be coupled by a plug 42 to a source of energizing potential, and also includes a switch 44 for turning the light source 40 on and off. When the intrinsic regions (described below) of the PIN diodes of switching arrangement 10 are not flooded with light, the diodes remain nonconductive. When switch 44 is closed or made conductive, the light source represented by light bulb 40 floods the intrinsic regions of the PIN diodes of switching arrangement 10 with photons, which, as mentioned, generates hole-electron pairs, thereby rendering the PIN diodes of switching arrangement 10 conductive, and in turn closing or rendering the switching arrangement conductive.

When switching arrangement 10 is conductive, current, which was previously flowing through resistor 22 under the impetus of the voltage across source 20, is bypassed through the switching arrangement. This bypass of current effectively disconnects resistor 22 from the circuit, by reducing the voltage thereacross to near zero. Those skilled in the art know that the effectiveness of such a switchng arrangement depends in part upon the ON-state or conductive resistance of switching arrangement 10, and in part upon the internal resistance of source 20. The internal resistance of source 20 is illustrated in FIG. 1a by a phantom resistor designated 20a, together with a source-representative battery 20'.

Figure 12:
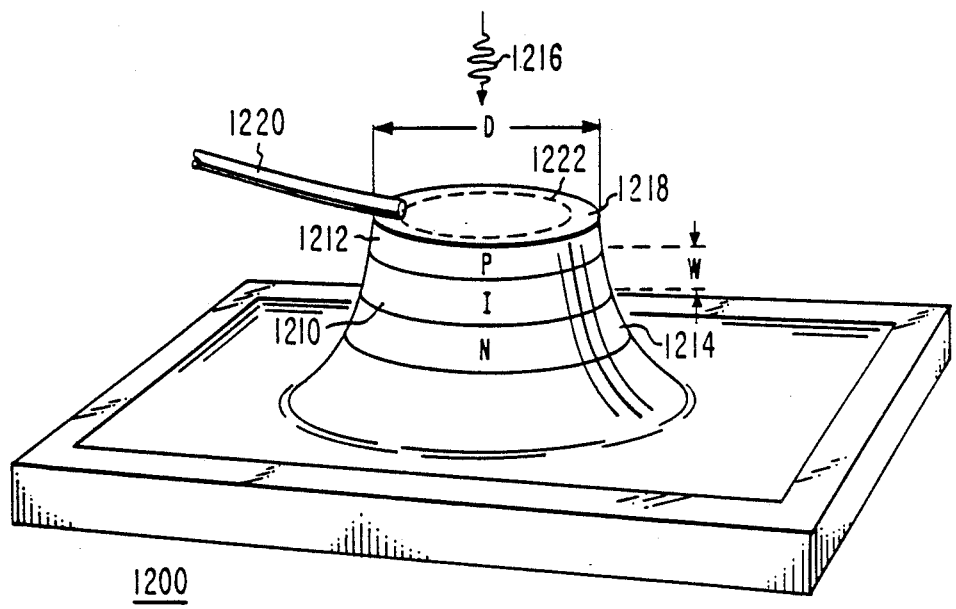
FIG. 12 is a perspective view of a vertical PIN diode.

FIG. 12 illustrates the structure of a single verticl PIN diode 1200. The diode 1200 includes an intrinsic (I) silicon region 1210, which may be lightly doped. Silicon has four valence electrons. A region 1212 overlies I region 1210. Region 1212 is doped in known fashion with boron atoms, each with three valence electrons. The boron atoms are substituted in the lattice for some of the silicon atoms, whereby three electrons are "accepted" by the boron to form four covalent bonds around each boron atom, and a positively-charged "hole" is created in the valence bands. Doped region 1212 is therefore a P region. Intrinsic region 1210 overlies a region 1214 which is doped, also in known fashion, with phosphorus atoms. Each phosphorus atom has five valence electrons. When substituted into the silicon lattice, each phosphorous atom donates one electron to the conduction band, creating a negative charge to form an N region. As illustrated in FIG. 12, the intrinsic region has a width W, measured between P and N regions. The diode also has a diameter D. As illustrated in FIG. 12, light represented by photon symbol 1216 impinges on the upper surface of diode 1200. An upper conductive surface layer 1218 makes ohmic contact with P region 1212, and is connected to a wire 1220. If layer 1218 is opaque, a window may be defined in the center of layer 1218, as suggested by dotted outline 1222. As an alternative to a window, a continuous layer 1218 may be formed from a transparent conductor such as a very thin film of a metal such as gold, copper, silver or indium, or a somewhat thicker layer of indium-tin oxide, tin oxide or cadmium oxide.

A theoretical basis is not well established for quantitative analysis of a reverse-biased PIN diode with "current injection" by means of photon absorption. It is expected that the quantitative analysis based upon forward bias theory will be at least indicative of trends for the reverse-bias case.

At high frequencies, the forward resistance of a PIN diode is given by the expression:

$$R_F = W^2/(I_f \tau_e \mu) \quad (1)$$

where

W is the width of the intrinsic region, measured between the P and N regions;

$I_f$ is forward current;

$\tau_e$ is the injected carrier lifetime in the intrinsic region; and $\mu$ is the sum of the hole and electron mobilities.

To withstand a particular reverse voltage, the series combination of PIN diodes 12 . . . 16 (FIG. 1) has a lower forward resistance $R_F$ than a single diode with equivalent reverse voltage standoff performance. The total forward resistance of the series-connected diodes is the sum of the forward resistances $R_F$ of the individual diodes. Since $R_F$ is proportional to the square of the width W (FIG. 12) of the intrinsic region, as described in equation 1, the forward resistance of a single diode with an intrinsic layer width of W is greater by a factor N than the sum of the forward resistances $R_F$ of a series combination of N diodes, each with an intrinsic layer width of W/N. Thus, the series combination of several diodes, each with relatively small or narrow intrinsic region widths W and with relatively large diameters D, will have a much lower series resistance than a single diode having a corresponding reverse voltage performance. This result must be further evaluated in conjunction with considerations of carrier lifetime and impurities as described below.

The series combination of large diameter, low reverse voltage PIN diodes, in addition to a lower series resistance than a diode with corresponding reverse voltage capability, also results in lower capacitance. Thus, if each diode 12, 14 . . . 16 of FIG. 1a is assumed to have a capacitance C, the effective value of capacitance between terminals 18 and 19 of switching arrangement 10 will be C/N, where N is the number of diodes. The relatively low-voltage diodes with large diameter D each have substantially higher capacitance than does the single, smaller-diameter diode. As is well known in the art, the overall capacitance of a series combination of capacitors has a value equal to that of one individual capacitor divided by the number in the serial combination. Thus, when a substantial number N of PIN diodes are connected in the switching arrangement 10 of FIG. 1, the effective individual capacitance is divided by N. Thus, not only is the forward resistance of the series of combination diodes arranged as illustrated in FIG. 1a lower than that of a single PIN diode with corresponding reverse voltage capabilities, but in addition, the operating speed of the series combination is much higher because of the reduction of the effective capacitance.

It should be noted that offsetting effects on forward resistance $R_E$ exist. Forward resistance $R_F$ is inversely proportional to the carrier lifetime $\tau_e$, as indicated in equation 1. The magnitude of $\tau_e$ depends upon the bulk recombination of the intrinsic material, which is the same for diodes made from the same semiconductor material. Carrier lifetime $\tau_e$ depends upon the ratio of surface area to volume of the intrinsic material of the diode, because the surface of the diode is a region in which the crystaline structure is disrupted, and therefore recombination tends to more readily occur at the surface than within the bulk material. Consequently, a smaller diode (i.e. a diode with small diameter D as in FIG. 12) which therefore has less internal volume of intrinsic material will have a greater ratio of surface area to volume than a larger diode, and therefore more recombination and a correspondingly shorter average recombination time $\tau_e$, which in turn results in a greater forward resistance. Another effect occurs when the intrinsic region width W decreases. The recombination time $\tau_e$ is further reduced by the impurities which are an unavoidable accompaniment of the intended P and N doping. These impurities are sites at which recombination takes place. When the width W of the intrinsic region is small, as in one of a plurality of small diodes, more of the volume than in a diode with larger width W will be occupied by these unintentional impurities, which reduce the effective carrier lifetime and tend to increase the series resistance RF. However, this is a secondary effect which may be reduced in importance by reducing the unwanted impurities in the doping.

Figure 1B:
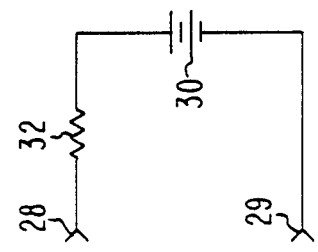

FIG. 1b illustrates another arrangement of a voltage source illustrated as a battery 30 and a load illustrated as resistor 32. As illustrated in FIG. 1b, battery 30 and resistor 32 are connected in series between terminals 28 and 29. The arrangement of FIG. 1b may be connected to terminal 18, 19 of switching arrangement 10 of FIG. 1a. In the absence of a connection to a switching arrangement such as 10 of FIG. 1a, terminal 28 will have a positive potential relative to terminal 29, because no voltage drop occurs in resistor 32 as a result of the lack of current flow therethrough due to the open circuiting of terminals 28 and 29. If terminals 28 and 29 of FIG. 1b are then connected to terminals 18 and 19 of switching arrangement 10 of FIG. 1a, the positive voltage at terminal 28 relative to that of terminal 29 will result in reverse-biasing of PIN diodes 12–16, and no current will flow through resistor 32. When light source 40 is turned on, diodes 12–16 become conductive and switching arrangement 10 closes, to thereby effectively connect together terminals 28 and 29 of the arrangement of FIG. 1b to allow current to flow through resistor 32 from battery 30. Thus, switching arrangement 10 of FIG. 1a can be used with either a series-connected or a shunt-connected voltage source and load resistor. The only difference in operation between these two arrangements is that current flows through resistor 22 of FIG. 1a when light source 40 is off and does not flow therethrough when light is on, whereas current flows through resistor 32 of FIG. 16 when light 40 of FIG. 1a is on and does not flow there through when light 40 is off.

Figure 2:
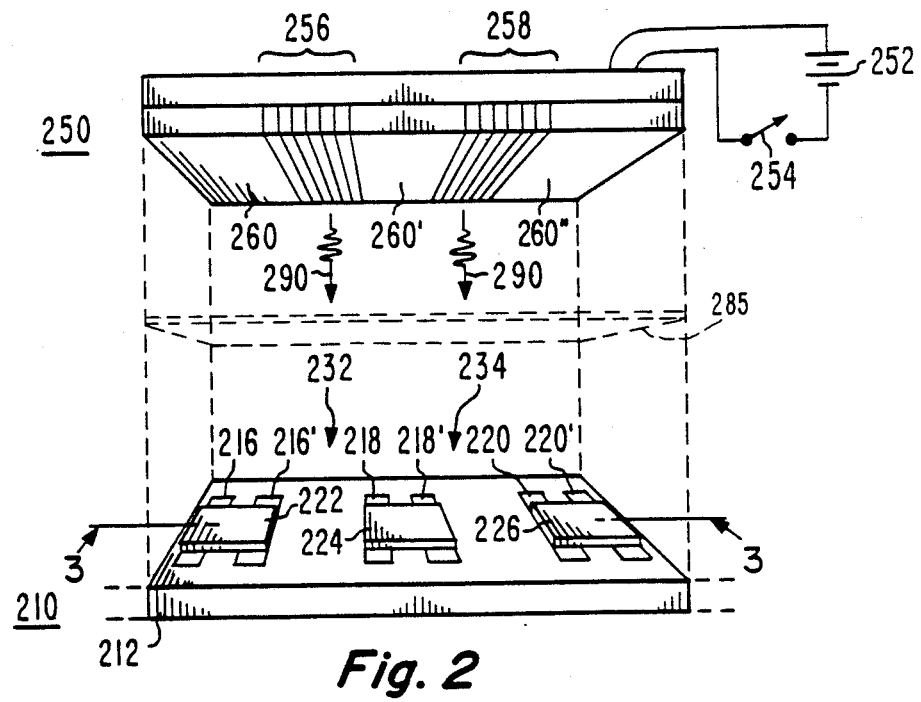
FIG. 2 is a simplified perspective or isometric, exploded view of a series-connected PIN diode arrangement in integrated-circuit form adapted to be coupled to a source of voltage and to a load, together with a semiconductor light source for control of the conductive state of the series-connected PIN diode arrangement.
Figure 3A:
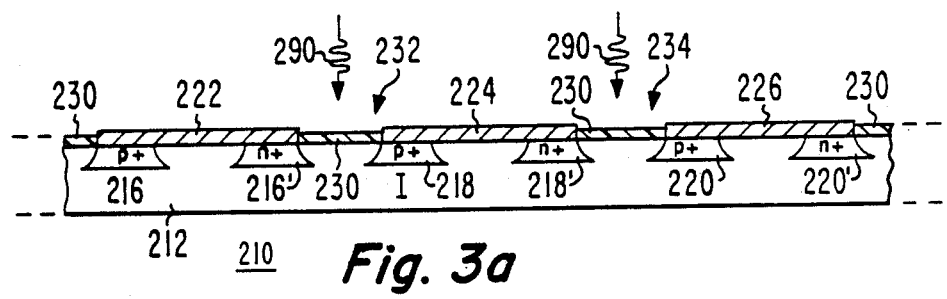
FIG. 3a is a cross-section of the central portion of the integrated circuit of FIG. 2 including series-connected PIN diodes.
Figure 3B:
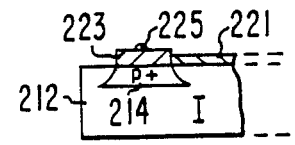

FIG. 2 is an exploded perspective or isometric view of an integrated circuit switching arrangement 210 in conjunction with a semiconductor light arrangement 250. FIGS. 3a and 3b illustrate cross-sections of the integrated circuit of switching arrangement 210 looking in the direction of section line 3—3. In FIGS. 2 and 3, switching arrangement 210 includes a substantially intrinsic semiconductor substrate 212 which may be lightly doped, as known in the art, as for example from U.S. Pat. No. 4,675,628 to Rosen. A number of P+ regions are illustrated as 214, 216, 218, 220. The cross-section of FIG. 3a illustrates a central portion of the substrate 212, while the cross-section of FIG. 3b illustrates one of the two ends. Also illustrated are a plurality of N+ regions, 216′, 218′, and 220′. Doped regions 214-220 are in the form of elongated parallel strips implanted or diffused from the upper side of substrate 212.

A surface metallization illustrated as 222 overlies and extends between P+ region 216 and N+ region 216′, connecting them together. Similarly, metallization 224 overlies and connects P+ region 218 and N+ region 218′. P+ region 220 and N+ region 220′ are connected by a further metallization 226. At the left and right extremes of substrate 212, not visible in FIGS. 2 and 3a, the last doped region, illustrated as 214 in FIG. 3b, is connected by a metallization 221 to its adjacent doped region (not illustrated). A metallized surface 223 overlies and makes ohmic electrical contact with doped region 214. A gold bump 225 formed on metallization 223 alows conductive contact by way of a bond wire to circuits external to switching arrangement 210.

Insulation layers illustrated in FIG. 3a as 230 overlie the regions between doped portions which are not electrically interconnected by a metallization. Insulating layers 230 are transparent and have their index of refraction and thickness selected to form an anti-reflection coating. A layer of dielectric insulation illustrated in phantom as 285 may lie between switching arrangement 210 and light arrangement 250, which when assembled may be contiguous, i.e., immediately adjacent and either touching or almost touching.

The region between N+ doped portions 216′ and P+ doped portion 218 is filled with substantially intrinsic (i) material. Similarly, the region between N+ doped portion 218′ and P+ doped portion 220′ of substrate 212 contains i material. This pattern continues to the left and to the right as illustrated in FIG. 3a, to the end portions such as illustrated in FIG. 3b. Doped N+ region 216′ and P+ region 218, together with the intervening i region, form a lateral PIN diode. Simiarly, N+ region 218′, P+ region 220 and the intervening i region constitute another PIN diode. Metallization region 224 connects P+ region 218 and N+ region 218′, so that the structure illustrated in FIGS. 2 and 3a defines two PIN diodes 232 and 234. PIN diodes 232 and 234, and other series-connected diodes not explicitly illustrated, are connected between end metallizations such as 223 of FIG. 3b. If the end metallizations are connected in-circuit with a source of direct voltage and with a load, as illustrated in schematic form in FIG. 1, metallization 222 will be poled positive relative to metallization 226, thereby reverse-biasing PIN diodes 232 and 234, and the other PIN diodes which are not illustrated. With this condition, no significant current will flow in the circuit. For this purpose, leakage current is disregarded as being insignificant. As mentioned, such an arrangement can withstand reverse voltages for long periods of time without the heating effects which occur in bulk semiconductor switches.

Figure 13:
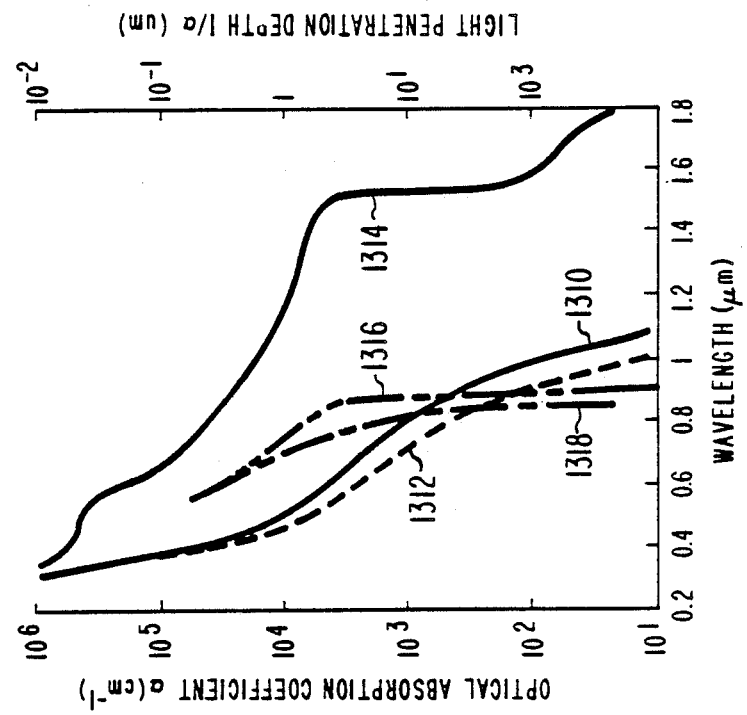
FIG. 13 is a plot of optical absorption coefficients as a function of wavelength.

For a given intrinsic semiconductor material only a certain range of wavelengths are absorbed sufficiently to generate significant photocurrent. Absorption is characterized by $\alpha$, the penetration distance required for 90% absorption. At wavelengths representing an energy less that the band-gap energy of the atoms of the semiconductor, the absorption coefficient $\alpha$, having dimensions of 1/distance, is too small to cause appreciable absorption. At wavelengths representing energy significantly greater than the band-gap energy, $\alpha$ is very large, and absorption therefore takes place principally near the surface of the semiconductor. FIG. 13, derived from a text by Sze, plots $\alpha$ versus light wavelength for silicon at 300° K. (1310), silicon at 77° K. (1312) and for germanium (1314), gallium arsenide (1316) and cadmium telluride (1318) at 300° K.

As mentioned, the absorption coefficient $\alpha$ is difficult to determine and to pre-establish in nonuniformly, heavily doped semiconductor. It it therefore difficult to determine how much light will pass through the doped P layer 1212 of the vertical PIN diode illustrated in FIG. 12. If the assumption is made that the absorption of light in doped layer 1212 is the same as that of the intrinsic material, then the thickness of the doped layer must be much less than the depth of penetration of the light, so that an appreciable amount of light may reach intrinsic layer 1210 to generate useful photocurrent. By reference to FIG. 13, for light at 800 nanometers (0.8 $\mu$m) and for silicon, the light penetration is less than 10 $\mu$m, and may be as little as 1 $\mu$m. The thickness of P+ layer 1212 of the diode of FIG. 12, therefore, should be less than 1 $\mu$m. In order for the photocurrent generated in intrinsic region 1210 to be useful, the width W of the intrinsic region should be small enough so that recombination effects do not reduce the effective photocurrent excessively. However, the width W of the intrinsic region should be large enough to meet the reverse voltage requirements, as described above. The attenuation of the light by P+ region 1212, and the constraints on the maximum width W of the intrinsic region by voltage and recombination factors, make selection of vertica diodes and light sources difficult.

Therefore, the depth of the P and N diffusions into the surface of the semiconductor of a lateral PIN diode is desirably approximately equal to $1/\alpha$. For example, if the lateral diodes of FIGS. 2 and 3 are formed in a silicon substrate, for operation in conjunction with light having a wavelength of 808 nanometers, the depth of the diffusions of the P- and N-doped regions as measured from the surface of the substrate should approximately equal $1/\alpha$, which is 10 micrometers.

Light source 250 of FIG. 2 is a solid-state arrangement of semiconductor laser diodes energized from a voltage source illustrated as a battery 252 controlled by a switch 254. Light source 250 includes first and second groupings 256 and 258 of semiconductor laser arrays, spaced apart by a plurality of spacers illustrated as 260, 260′, 260″. The orientation of light source 250 relative to switching arrangement 210, and the spacing and dimensions of spacers 260, are selected so that a group 256 of laser diodes overlies the intrinsic region of lateral PIN diode 232, and group 258 of laser diodes overlies the intrinsic region of PIN diode 234. When switch 254 is closed, the laser diodes of groups 256 and 258, and of other groups of laser diodes (not illustrated) are simultaneously energized, to cause light illustrated by photon symbols 290 to impinge upon antireflective coatings 230 (FIG. 3a) and enter the intrinsic region between the doped portions of PIN diodes 232 and 234. As mentioned, this creates hole-electron pairs which produce conduction, as described in conjunction with FIG. 1.

Figure 4A:
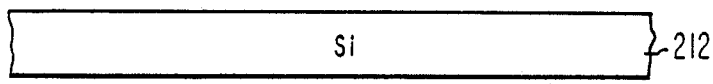
Figure 4B:

FIGS. 4a–4i illustrate steps in the processing of substrate 212 of FIGS. 2 and 3 for generating the lateral PIN diode structure. In FIG. 4a, intrinsic silicon wafer 212 may be doped with a slight P or N impurity level. In FIG. 4b, a layer of silicon dioxide insulator illustrated as 410 is formed on the upper surface of wafer 212.

Figure 4C:
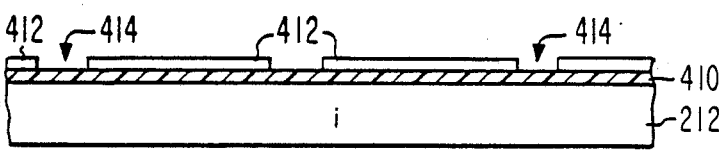

FIG. 4c illustrates a deposited pattern of photoresist 412, leaving uncovered a pattern of rectangular apertures 414.

Figure 4D:
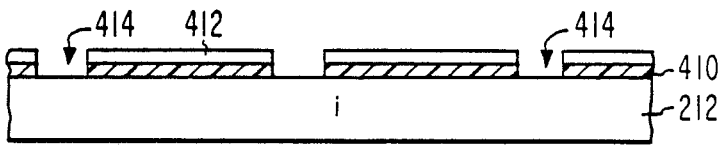

FIG. 4d illustrates the result of etching through the silicon dioxide layer 410 at apertures 414.

Figure 4E:
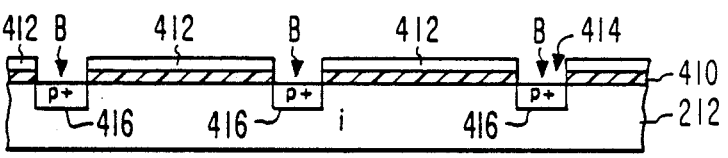

FIG. 4e illustrates the step of ion deposition or implantation of boron (B) atoms to form P+ regions 416 within the body of semiconductor wafer 212.

Figure 4F:
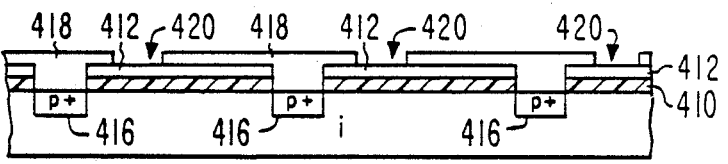

FIG. 4f illustrates the deposition by means of a further mask of a further layer 418 of photoresist, which fills apertures 414, and which defines further apertures 420.

Figure 4G:
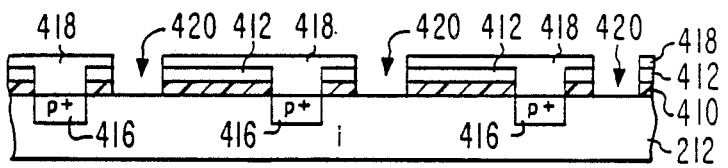

FIG. 4g shows the result of a further etching step, in which the etchant removes a portion of photoresist layer 412 and insulator 410.

Figure 4H:
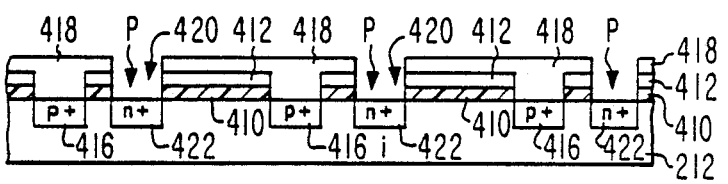

FIG. 4h illustrates the ion implantation of phosphorus (P) atoms to form N+ regions 422.

Figure 4I:
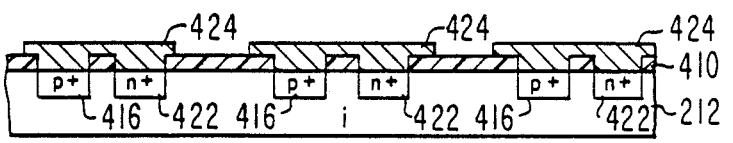

Finally, FIG. 4i illustrates the result of the steps of removal of photoresist, application of a further photoresist layer by means of a mask, and deposition of a layer 424 of metal in a known manner, as by evaporation.

Figure 5:
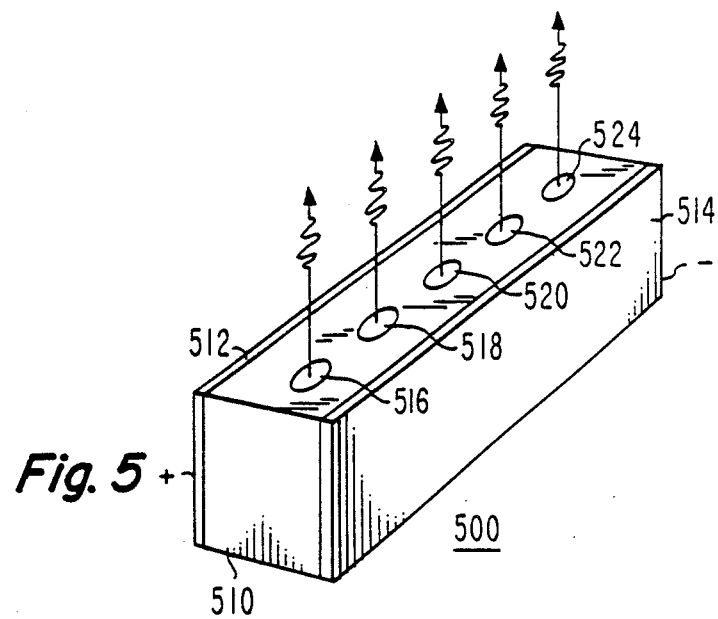
FIG. 5 illustrates a conventional semiconductor laser diode array.

FIG. 5 illustrates a laser diode array 500 as is known in the art. In FIG. 5, laser diode array 500 includes a layered semiconductor substrate 510, the individual layers of which are not illustrated. Semiconductor substrate 510 lies between metallized layers 512 and 514, which are adapted to receive direct voltage, illustrated as positive (+) on layer 512, and negative (−) on layer 514, in order to produce light radiation from a plurality, illustrated as five, of discrete radiation sites 516, 518, 520, 522, and 524.

Figure 6:
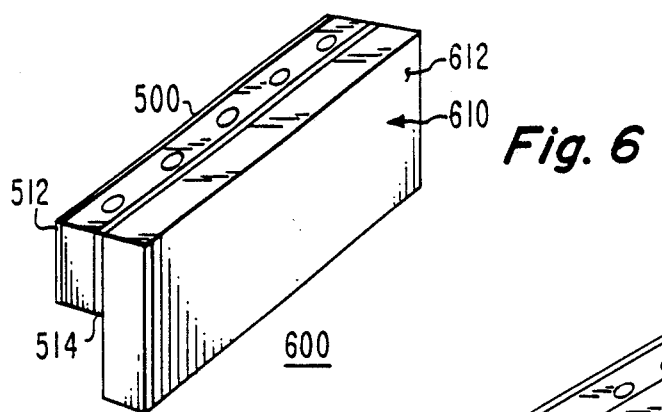
FIG. 6 illustrates the array of FIG. 5 joined to a conductive member.

FIG. 6 illustrates a laser diode array 500 bonded, as by soldering, to a rectangular block 610 of thermally conductive material such as metal or surface-metallized beryllium oxide (BeO). Block 610 has a surface 612 remote from the surface to which array 500 is bonded. When so arranged, metallization layer 514 is electrically and thermally bonded to block 610 to form an assemblage 600. If sufficiently large, block 610 can itself dissipate the heat produced by array 500. As described below, block 610 may also be used as a heat transfer element. For consistency in terminology, block 610 will be termed a "heat sink."

Figure 7:
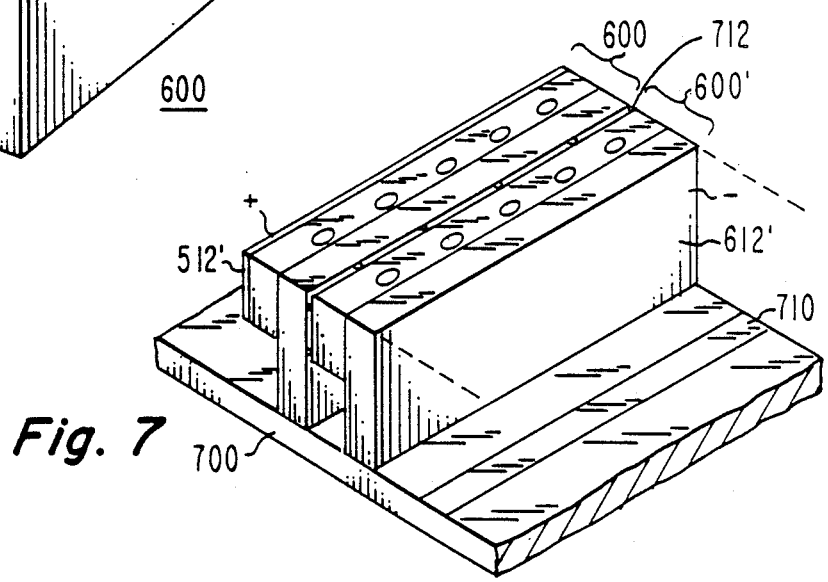
FIG. 7 illustrates two of the arrangements of FIG. 6 stacked together to form a 2-dimensional laser diode array on a holder.

FIG. 7 illustrates the stacking of two assemblages such as assemblage 600 of FIG. 6 and a further similar assemblage designated 600' to form a two-dimensional radiating array of laser diodes. In FIG. 7, a thermally conductive BeO mounting substrate 700 has deposited thereon a series of spaced metallization stripes, one of which is illustrated as 710. Metallization stripes 710 provide a surface to which heat sinks 610 of assemblages 600 may be attached, as by soldering. When so arranged, the laser diode array of assemblage 600' has a heat sink 610 on each side, each of which conducts heat from the laser diode array to mounting 700, which either rejects the heat directly or conducts it to a further heat sink, not illustrated.

In FIG. 7, the two assemblages 600' are spaced apart slightly to form a space 712, and electrical contact is made by means of gold bumps, not separately designated. Such gold bumps provide a certain amount of cushioning to aid in preventing stresses due to thermal effects, and also to provide some thermal contact. Alternatively, the adjacent surfaces of the assemblages 600 may be soldered together directly, without gold bumps. In either manner of assembly, the arrays of laser diodes are energized in a series combination, with electrical connections made to apply positive voltage to surface 512' and negative voltage to surface 612'.

Figure 8:
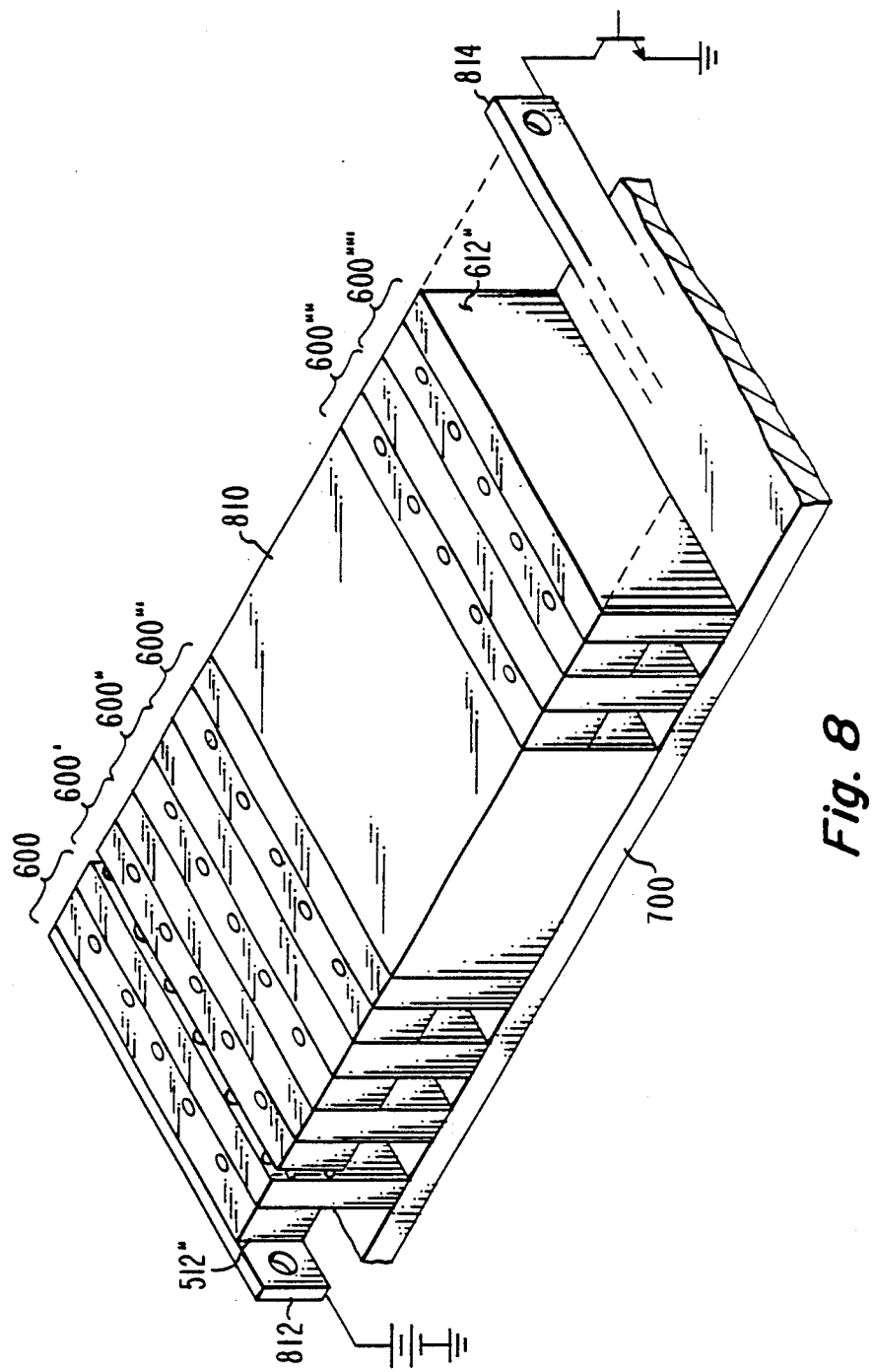
FIG. 8 is similar to FIG. 7 but includes spacers and electrical contacts.

The stacking concept illustrated in FIG. 7 is extended as illustrated in FIG. 8, in which stacks including a plurality of assemblages 600, 600', etc., are spaced apart by thermally and electrically conductive spacers 810, all thermally sunk to BeO substrate 700. Electrical connections are made by buses illustrated as 812 and 814 to the appropriate surfaces of the end laser diode arrays. The correspondence of the arrangement of FIG. 8 to that of light source 250 of FIG. 2 is obvious. Spacer 810 of FIG. 8 corresponds to a spacer 260 of FIG. 2. The width of spacer 810 is selected to be equal to the width of metallization 224 of FIG. 2, so that the two-dimensional arrays of laser diodes overlie the intrinsic regions of the PIN diodes of switching arrangement 210 of FIG. 2.

Figure 9:
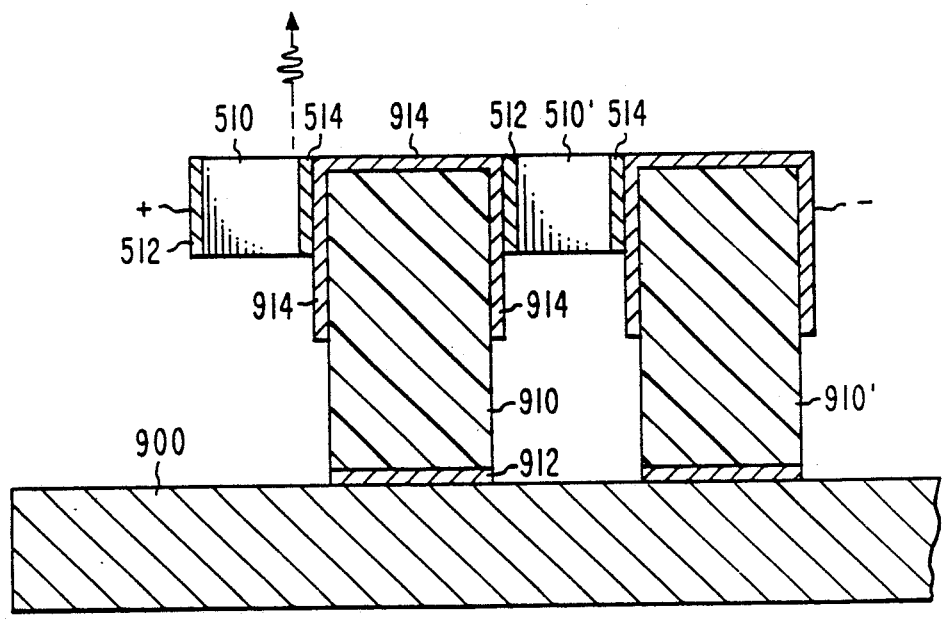
FIG. 9 is a cross-section of an arrangement similar to that of FIG. 8, with a metal holder and partially-metallized thermally conductive member or heat sink.

FIG. 9 is a cross-section of an arrangement similar to FIG. 8, but in which the mounting 900 is made from metal. If electrically conductive heat sinks were used, as in FIGS. 7 and 8, a complete conductive path would bridge across the terminals of each laser diode array, with the result of short-circuiting the energization of the diodes. In the arrangement of FIG. 9, this is avoided by separately metallizing upper and lower parts of BeO heat sinks 910. For example, BeO heat sink 910 includes a lower metallization 912 which may be soldered to holder 900, and also includes an upper metallization 914 which may be soldered on the one side to metallization 514 of laser diode 510 and on the other side to metallization 512 of laser diode 510'. Thus, laser diodes 510, 510' of FIG. 9 are electrically connected in series for energization, and each is thermally sunk to mounting 900 by its associated heat sink 910, 910' respectively. Since lower metallization 912 is not electrically connected to upper metallization 914, the diodes are not short-circuited.

Figure 10:
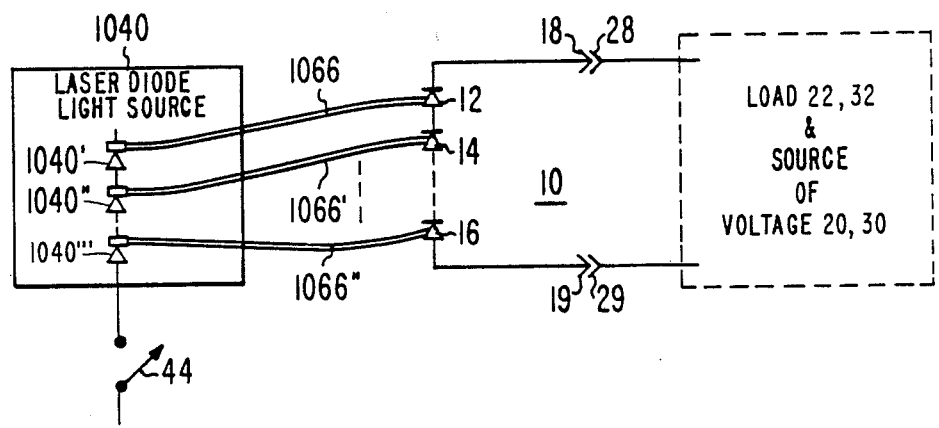
FIG. 10 is a simplified schematic diagram of an arrangement similar to that of FIG. 1, in which light is coupled to the individual diodes by fiber-optic cables.

FIG. 10 is a simplified schematic diagram illustrating a series combination of diodes coupled, by connector sets 18, 28 and 19, 29 to a load 22 or 32 and to a voltage source 20 or 30, respectively, as in FIG. 1. Elements of FIG. 10 corresponding to those of FIG. 1 are designated by the same reference numerals. In FIG. 10, diodes 12, 14 . . . 16 of switching arrangement 10 are reverse-biased by the voltage established across terminals 28 and 29 by the voltage source (20 or 30). Instead of a light source 40 as in FIG. 1, the arrangement of FIG. 10 supplies light from a laser diode source 1040 which is controlled by electrical energy controlled by a switch illustrated symbolically as 44. Those skilled in the art realize that switch 44 may be a semiconductor switching element such as one or more bipolar transistors, FETs, or the like. A plurality of fiber-optic cables 1066, 1066' . . . 1066" couple the light produced by light source 1040 individually to the diodes 12, 14 . . . 16. The terminations of the fiber-optic cables in the PIN diodes may be as illustrated in U.S. Pat. No. 4,675,624 to Rosen et al. Laser diode light source 1040 may include one or more laser diodes illustrated as 1040', 1040" . . . 1040''', each coupled individually to one of fiber optic cables 1066, 1066', etc. Alternatively, fiber optic cables 1066 may be coupled together within light source 1040 by a star coupler driven by one or more lasers, as described in conjunction with FIG. 11. The fiber optic coupling arrangements allow the laser light source to be remote from the PIN diodes.

Figure 11:
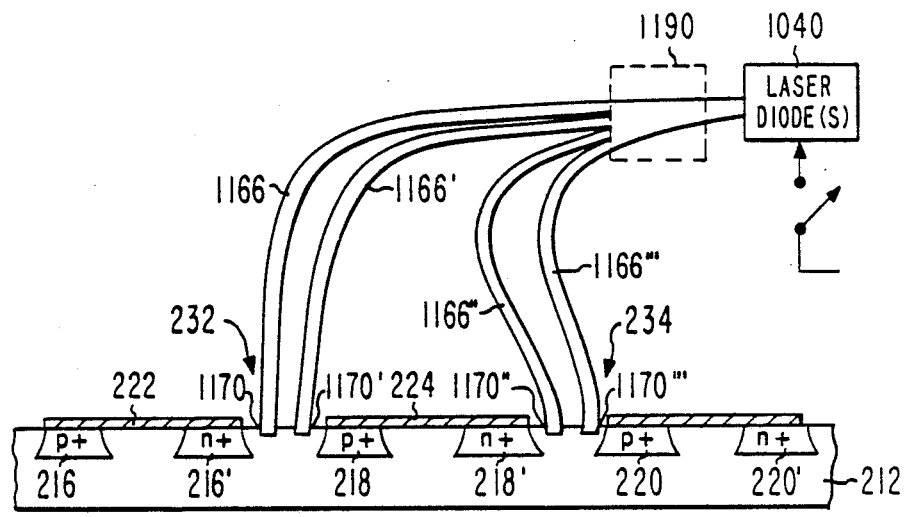
FIG. 11 is a simplified cross-sectional view of an integrated-circuit PIN diode array, in which light is coupled to the individual diodes by means of fiber-optic cables.

FIG. 11 is a simplified cross-sectional view of an integrated circuit with transverse PIN diodes similar to that of FIG. 3, in which the coupling of light is accomplished by fiber-optic cables. Elements of FIG. 11 corresponding to those of FIGS. 3 or 10 are designated by the same reference numbers. In FIG. 11, a plurality of fiber-optic cables 1166, 1166' energize from a star coupler 1190 and enter wells 1170, 1170', respectively, depressed below the surface of substrate 212 in the region of PIN diode 232. Similarly, fiber optic cables 1166" and 1166''' emerge from star coupler 1190 and enter wells 1170" and 1170''', respectively, in the area of PIN diode 234. The arrangement of star coupler 1190 in conjunction with a plurality of laser diodes has the advantage of summing or combining the output light power of all the laser diodes, and dividing the sum light power substantially equally among the PIN diodes. If a laser diode fails or changes power, this merely changes the overall power proportionately, and there cannot be a complete failure to illuminate a particular PIN diode, and thus degradation of the laser light source results in graceful, proportional degradation in the switching characteristics of switching arrangement 10.

When high currents (above 50 amperes, for example) are to be switched at high voltages, the switching diodes generate significant heat. When only a single switch operation occurs infrequently, the mass of the diode and its mounting may be sufficient to prevent the heat from causing the structure to reach a destructive temperature. A temperature is considered destructive if the desired reliability is impaired. A silicon diode may generally be considered to have reached a destructive temperature at a temperature lying between 140° C. to 200° C. In general, the requirement for good thermal performance suggests spreading the switching diodes over a large area for spreading the heat generated therein to keep temperatures low. When, in addition to high current and voltage, relatively high switch repetition rates occur, the structure must be heat-sunk sufficiently to keep the temperature below the destructive level.

For the low impedance circuits generally encountered at high current levels, the inductance of the associated circuits may adversely affect the rise time of the current following switch closure. The inductance is affected by the physical structure of the switch. In order to reduce the inductance of the switch diodes, it is generally desirable to keep the diodes and the associated voltage source and load in a relatively small area, to minimize the size of circuit loops. This, however, is contrary to the general principles of temperature control. It is therefore difficult to generate a switch structure which simultaneously controls temperature resulting from repetitive operations at high voltage and current, and which is nevertheless small enough to reduce stray circuit reactances.

Figure 14:
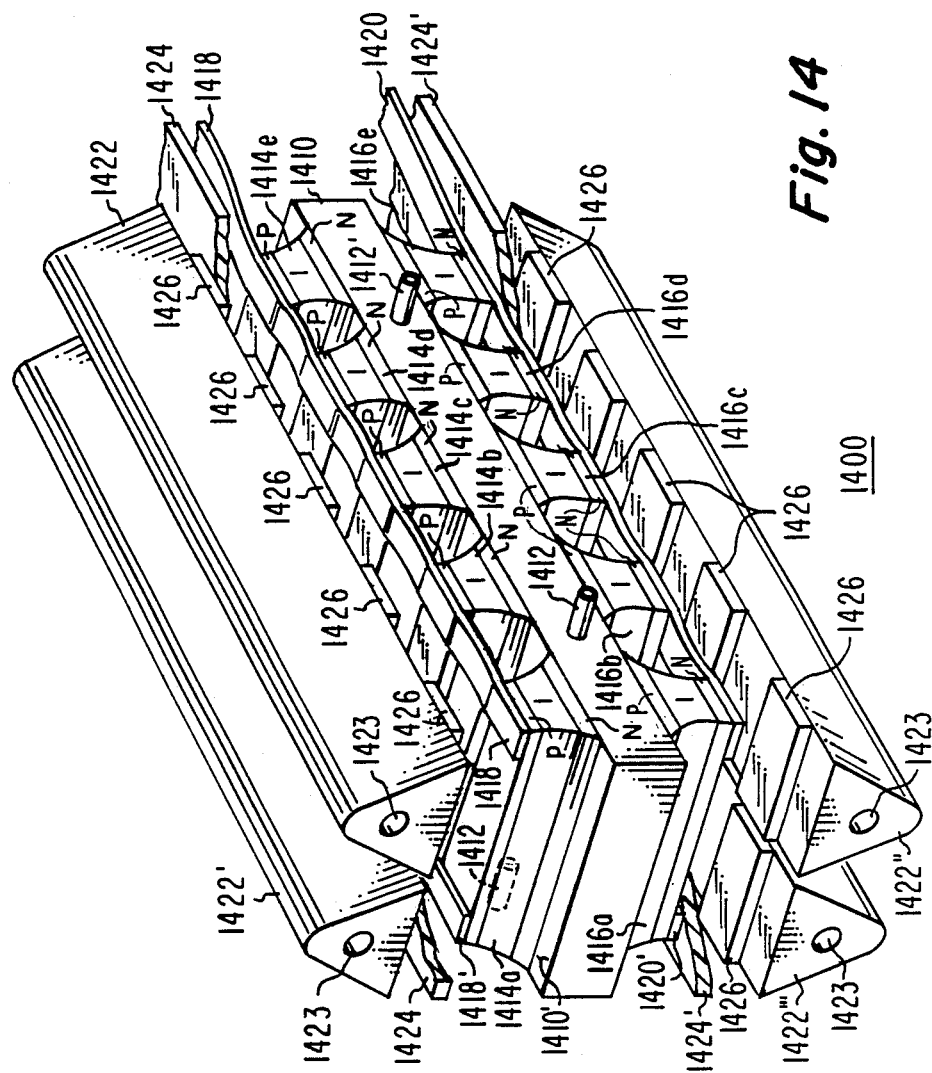
FIG. 14 is a view of a completed diode array with heat sinks.

FIG. 14 is an exploded, simplified perspective or isometric view of a switch element 1400, partially cut away, including a metal heat sink 1410 perforated by two coolant tubes 1412, 1412'. The upper surface 1410' of heat sink 1410 is bonded to the N electrodes of a plurality of vertical PIN diodes 1414a–1414e, and the lower surface 1410" of heat sink 1412 (not visible in FIG. 14) is bonded to the P electrodes of a plurality of PIN diodes 1416a–1416e. Thus, the N electrodes of diodes 1414 are electrically connected to the P electrodes of diodes 1416.

Electrical connections are made in common to the P electrodes of diodes 1414 by a pair of bus conductors 1418, 1418'. Electrical connections are also made in common to the N electrodes of diodes 1416 by a second pair of bus electrodes 1420, 1420'. Since the P electrodes of diodes 1414a–e are connected together, and the N electrodes of diodes 1414a–e are also connected together, diodes 1414 are all connected in a parallel combination. The parallel combination of diodes 1414 is connected between conductor set 1418 and 1420, poled for conduction when conductor set 1418 is positive relative to conductor set 1420.

Similarly, electrical connections are made in common to the P electrodes of PIN diodes 1416a–e by heat sink 1410, and to the N electrodes of diodes 1416a–e by bus conductor set 1420, 1420'. Thus, all diodes 1416 are connected in parallel. Since heat sink 1410 is a common conductor connected to the N electrodes of diodes 1414 and to the P electrodes of diodes 1416, the parallel combination of diodes 1414a–e is connected in series with the parallel combination of diodes 1416a–e, poled for forward conduction when conductor set 1418 is at a positive voltage relative to conductor set 1420.

A further pair of heat sinks 1422, 1422' is located above diodes 1414a–e, and is electrically insulated therefrom by a layer of transparent dielectric material (illustrated as partially cut away) 1424. Each heat sink includes an aperture 1423 for the flow of coolant therethrough. The flat surfaces of heat sinks 1422, 1422' facing insulation 1424 support a plurality of laser diode arrays 1426, each of which is similar to the array of FIG. 8, oriented to project light downward towards laser diodes 1414. A further pair of heat sinks 1422", 1422''' similar to heat sinks 1422, 1422' is located below PIN diodes 1416, and is electrically isolated therefrom by a transparent insulation material 1424', illustrated as partially cut away. Flat surfaces of heat sinks 1422", 1422''' facing diodes 1416 support further arrays of laser diodes 1426, which are oriented to project light upward toward diodes 1416.

In operation, conductors 1418, 1418' are connected together at a point external to switch assembly 1400, to form a terminal corresponding to terminal 29 of FIGS. 1a or 1b. Similarly, conductors 1420, 1420' are connected together to form a terminal corresponding to terminal 28 of FIGS. 1a or 1b. Switch element 1400, in this case, would correspond to switching arrangement 10 of FIG. 1a, and diodes 1414a–e and 1416a–e would be reverse-biased, and no current would flow therethrough in the absence of light. Laser diode arrays 1426 of FIG. 14 may be simultaneously energized by way of conductors (not illustrated in FIG. 14). The light produced by laser diode arrays 1426 is partially blocked by conductors 1418, 1418', 1420, and 1420', but in the regions between the conductors the light falls upon the P electrodes of diodes 1414 and upon the N electrodes of diodes 1416. In addition to the light falling upon the P regions of diodes 1414 and upon the N regions of diodes 1416, a significant amount of light falls directly upon and enters the exposed edges of the intrinsic regions of the diodes. The light entering the intrinsic region of each diode either directly or by way of a doped region is absorbed therein and generates photoconductors which render the diodes conductive, and which also result in the flow of photocurrent which switches the load, as described in conjunction with FIG. 1.

During operation of switch 1400, coolant is circulated by nonconductive pipes through heat sink 1410. Heat sink 1410 thus "floats" electrically, without a voltage reference, and does not affect switch operation. Coolant is also circulated through apertures 1423 to maintain the temperature of laser diode array 1426.

The described switch structure is capable of high power dissipation, and the path taken by the flow of current is a relatively small loop, so the inductance will be relatively small and the rise time of current may be large. The structure of switch element 1400 is also compact, so that a number of such structures may easily be cascaded in order to achieve higher reverse voltage capability than that achievable by one such structure alone. The compact structure keeps the loop inductance to a minimum. In order to form such a series combination, conductor set 1420 of each switch element 1400 is connected to conductor set 1418 of the next switch element in the stack.

FIGS. 15 illustrates some of the important steps in making a switch structure such as 1400 of FIG. 14. In FIG. 15a, an intrinsic semiconductor substrate 1500 is doped P near the upper surface and N near the lower surface. Substrate 1500 may be as large as a semiconductor wafer, ordinarily three or four inches (75 or 100 mm) in diameter. Substrate 1500 has a thickness of about 10 mils (0.002 mm) and is doped to depths determined in the manner described above. The outer surface of the P electrode may also be plated with a transparent conductive layer to which bus conductors may later be fastened. FIG. 15b illustrates the result of plating a thick layer 1510 of copper (Cu) onto the bottom surface of substrate 1500, adjacent to and in ohmic contact with the N doped layer. Copper layer 1510 may be as thick as desired, and may desirably be ¼ inch (6 mm) thick to provide a rugged structure for later handling. Also, copper layer 1510 as illustrated in FIG. 15b has been etched or shaped on its lower surface 1512 with a pair of semicircular cross-section trenches 1514 which are elongated in a direction perpendicular to the plane of the FIGURE. FIG. 15c illustrates a second structure similar to that of FIG. 15b, but in which the copper layer 1522 was plated on the opposite side of a doped semiconductor wafer 1520, adjacent to the P doped region, and with semicircular trenches 1524 on the upper side 1526.

Figure 15A:
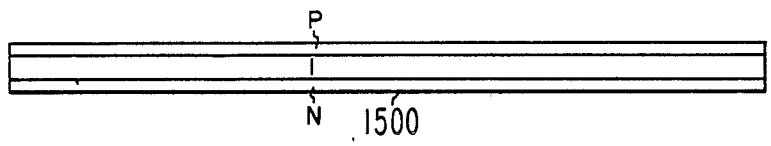
FIGS. 15a–15f show steps in making the array of FIG. 14.
Figure 15B:
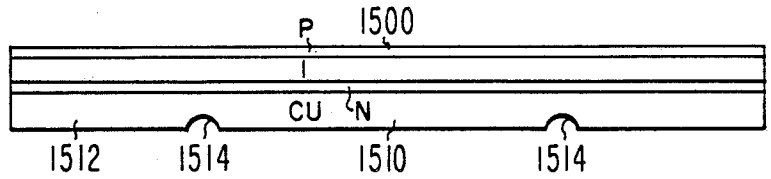
Figure 15C:
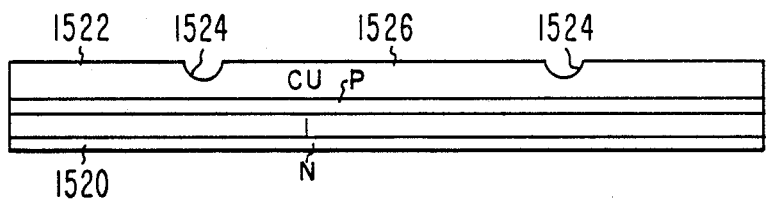
Figure 15D:
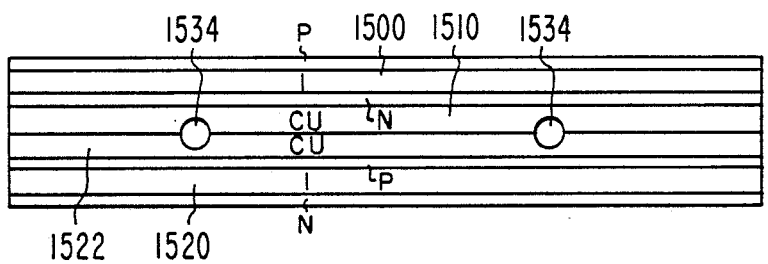

FIG. 15d illustrates the result of bonding together the sides 1512, 1526 of copper layers 1510, 1522, by heat and pressure, brazing or soldering. As illustrated, the semicircular trenches mate to form fluid channels 1534, to which pipes such as 1412, 1412' of FIG. 14 may be connected.

Figure 15E:
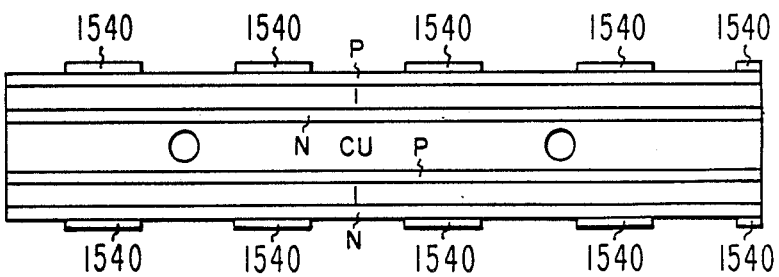
Figure 15F:
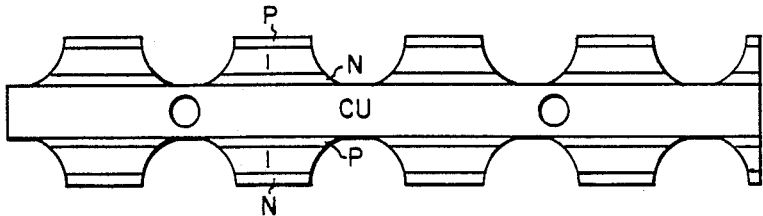

FIG. 15e represents the deposition of elongated strips of photoresist material 1540 onto the upper and lower surfaces of the structure of FIG. 15d. The direction of elongation is parallel to the direction of channels 1534. FIG. 15f illustrates the result of etching by a corrosive bath of that portion of the structure of FIG. 15e which is unprotected by photo resist. The etching continues until copper is exposed, and the photoresist is then removed. The resulting structure may then be passivated and coated with protective and/or antireflective layers, all in known fashion, and assembled into the structure of FIG. 14.

Other embodiments of the invention will be apparent to those skilled in the art. For example, semiconductor light sources such as LEDs may be used instead of laser diodes. The integrated circuits may include dopings and layers other than those described in detail, as known in the art. Instead of using silicon as a substrate, other materials may advantageously be used, such as GaAs, with appropriate known changes in the doping atoms. While the sources of energizing potential as described above have been purely direct current (DC) sources, any source of energizing potential can be used so long as it includes a direct component (i.e. a source of alternating voltage superimposed upon a direct voltage may be used). The laser diodes or laser diode arrays may, as known, be operated in a pulsed mode, which may result in greater light output; if the laser pulse rate is sufficiently high, the PIN diodes will remain continuously conductive, because the effective lifetime of the charge carriers exceeds the inter-pulse duration. Instead of a dielectric layer such as 1424, 1424' of FIG. 14, the PIN diode may simply be spaced away from adjacent structures which are at significantly different voltages.

What is claimed is:

1. An electrical switch, device comprising:
   a first PIN diode comprising a substantially intrinsic first semiconductor portion including mutually opposed first and second flat surfaces, said first semiconductor portion being doped near said first surface with one of N and P impurities, and near said second surface with the other one of said N and P impurities;
   a second PIN diode comprising a substantially intrinsic second semiconductor portion including mutually opposed first and second flat surfaces, said second semiconductor portion being doped near said first surface with said one of said N and P impurities, and near said second surface with said other one of said N and P impurities, said first surface of said second semiconductor portion being electrical contact with said second surface of said first semiconductor portion for generating a physical stack of PIN diodes in which said PIN diodes are electrical connected in series, and poled for current flow in the same direction therethrough between said first surface of said first semiconductor portion and said second surface of said second semiconductor portion;
   coupling means coupled to said first surface of said first semiconductor portion and to said second surface of said second semiconductor portion and adapted for coupling to a source of electrical potential, which includes a direct current component, associated with a load to be switched, in a manner which simultaneously reverse-biases said first and second PIN diodes, said reverse bias substantially preventing the flow of current through said diodes; and
   switching control means coupled to said first and second PIN diodes, said switching control means comprising light generating means for simultaneously illuminating at least an interior portion of said first and second PIN diodes with light for causing said first and second PIN diodes to conduct in the presence of light, and for allowing said PIN diodes to revert, in the absence of light, to said condition of reverse bias and prevention of the flow of current therethrough.

2. A device according to claim 1, wherein said light generating means is coupled to said first and second semiconductor portions in such a manner that said light enters said first and second semiconductor portions from at least one of said first surface of said first semiconductor portion and said second surface of said second semiconductor portion.

3. A device according to claim 1, wherein said light generating means is coupled to said first and second semiconductor portions in such a manner that said light enters said first semiconductor portion throught said first surface of said first semiconductor portion and enters said second semiconductor portion throught said second surface of said second seminconductor portion.

4. A device according to claim 3, wherein said light entering said first surface to said first semiconductor portion is substantially entirely absorbed in said first semiconductor portion, and said light entering said second surface of said second semiconductor portion is substantially entirely absorbed in said second semiconductor portion.

5. A device according to claim 1, wherein said one of said N and P impurities is N, and said other one of said N and P impurities is P, and said coupling means couples said first surface of said first semiconductor portion to a positive terminal of said source of electrical potential associated with a load, and couples said second surface of said second semiconductor portion to a negative terminal of said source of electrical potential associated with a load.

6. A device according to claim 5, wherein said source of electrical potential includes positive and negative terminals, and said load includes first and second terminals, and said positive terminal of said source of electrical potential is coupled to said first terminal of said load, and said coupling means comprises:
  means for coupling said first surface of said first semiconductor portion to said second terminal of said load; and
  means for coupling said second surface of said second semiconductor portion to said negative terminal of said source of electrical potential, whereby said load receives current from said source of electrical potential during those intervals in which said light generating means of said switching control means illuminates said first and second PIN diodes with light.

7. A device according to claim 5, wherein said source of electrical potential includes positive and negative terminals, and said load includes first and second terminals, and said positive and negative terminals of said source of electrical potential are coupled to said first and second terminals of said load, respectively, and said coupling means comprises:
  means for coupling said first surface of said first semiconductor portion to said first terminal of said load; and
  means for coupling said second terminal of said second semiconductor portion to said second terminal of said load, whereby said load receives current from said source of electrical potential during those intervals in which said light generating means of said switching control means does not illuminate said first and second PIN diodes.

8. A device according to claim 1, wherein said one of said N and P impurities is P, and said other one of said N and P impurities is N, and said coupling means couples said first surface of said first semiconductor portion to a negative terminal of said source of electrical potential associated with a load, and couples said second surface of said second semiconductor portion to a positive terminal of said source of electrical potential associated with a load.

9. A device according to claim 8, wherein said source of potential includes positive and negative terminals, and said load includes first and second terminals, and said negative terminal of said source of electrical potential is coupled to said first terminal of said load, and said coupling means comprises:
  means for coupling said first surface of said first semiconductor portion to said second terminal of said load; and
  means for coupling said second surface of said second semiconductor portion to said positive terminal of said source of electrical potential, whereby said load receives current from said source of electrical potential during those intervals in which said light generating means of said switching control means illuminates said first and second PIN diodes with light.

10. A device according to claim 1 wherein said first surface of said second semiconductor portion is physically connected to said second surface of said first semiconductor portion by a metallic conductor of both heat and electricity.

11. A device according to claim 10 wherein said metallic conductor of both heat and electricity is coupled to heat transfer means.

12. A device according to claim 11 wherein said heat transfer means comprises at least one fluid channel formed within said metallic conductor of both heat and electricity, said channel being adapted for the flow of a coolant fluid therethrough.

* * * * *

UNITED STATES PATENT AND TRADEMARK OFFICE
CERTIFICATE OF CORRECTION

PATENT NO. : 4,899,204

DATED : February 6, 1990

INVENTOR(S) : Har'el Rosen et al.

It is certified that error appears in the above-identified patent and that said Letters Patent is hereby corrected as shown below:

Title page,
Abstract, line 14, "bath" should be --both--.

Column 2, line 15, "As as a result," should be --As a result,--.

Column 2, line 38, before "the" insert --in--.

Column 4, line 53, "verticl" should be --vertical--.

Column 5, line 25, "$R_F=W^2/(I_f\tau_{e_\mu})$" should be --$R_F=W^2/(I_f\tau_e\mu)$--.

Column 6, line 10, "$R_E$" should be --$R_F$--.

Column 7, line 2, "there through" should be --therethrough--.

Column 7, line 34, "alows" should be --allows--.

Column 8, line 46, "vertica" should be --vertical--.

Column 10, line 4, before " 600' " insert --600--.

Column 14, line 45, before "electrical" insert --in--.

Column 14, line 48, "electrical" should be --electrically--.

UNITED STATES PATENT AND TRADEMARK OFFICE
CERTIFICATE OF CORRECTION

PATENT NO. : 4,899,204

DATED : February 6, 1990

INVENTOR(S) : Har'el Rosen et al.

It is certified that error appears in the above-identified patent and that said Letters Patent is hereby corrected as shown below:

Column 15, line 15, "throught" should be --through--.

Column 15, line 17, "throught" should be --through--.

Column 15, line 18, "seminconductor" should be --semiconductor--.

Signed and Sealed this

Fourteenth Day of May, 1991

Attest:

HARRY F. MANBECK, JR.

*Attesting Officer*   *Commissioner of Patents and Trademarks*